United States Patent
Moiseev et al.

(10) Patent No.: US 11,514,666 B2
(45) Date of Patent: Nov. 29, 2022

(54) METHOD AND SYSTEM OF SIMILARITY-BASED DEDUPLICATION

(71) Applicant: Huawei Technologies Co., Ltd., Shenzhen (CN)

(72) Inventors: Stanislav Vladimirovich Moiseev, Moscow (RU); Denis Vasilievich Parfenov, Moscow (RU); Denis Vladimirovich Parkhomenko, Moscow (RU); Dmitry Nicolaevich Babin, Moscow (RU); Kun Guan, Hangzhou (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 790 days.

(21) Appl. No.: 16/442,102

(22) Filed: Jun. 14, 2019

(65) Prior Publication Data
US 2019/0294589 A1    Sep. 26, 2019

Related U.S. Application Data

(63) Continuation of application No. PCT/RU2016/000888, filed on Dec. 15, 2016.

(51) Int. Cl.
*G06V 10/75* (2022.01)
*G06F 17/14* (2006.01)
(Continued)

(52) U.S. Cl.
CPC .......... *G06V 10/758* (2022.01); *G06F 3/0608* (2013.01); *G06F 3/0641* (2013.01);
(Continued)

(58) Field of Classification Search
CPC ... G06V 10/758; G06F 3/0608; G06F 3/0641; G06F 17/148; G06F 3/0673;
(Continued)

(56) References Cited

U.S. PATENT DOCUMENTS

| | | | | |
|---|---|---|---|---|
| 5,710,835 A | * | 1/1998 | Bradley | ......... H04N 19/63 375/E7.064 |
| 7,974,478 B2 | * | 7/2011 | Bashyam | ......... G06T 9/001 382/233 |

(Continued)

FOREIGN PATENT DOCUMENTS

| | | |
|---|---|---|
| CN | 1219079 A | 6/1999 |
| CN | 102222085 A | 10/2011 |

(Continued)

OTHER PUBLICATIONS

Zhao et al., "A Method of Image Feature Extraction Using Wavelet Transforms," ICIC 2009, LNCS 5754, pp. 187-192, Springer-Verlag Berlin Heidelberg (2009).

(Continued)

*Primary Examiner* — Pierre M Vital
*Assistant Examiner* — Zuheir A Mheir
(74) *Attorney, Agent, or Firm* — Leydig, Voit & Mayer, Ltd.

(57) ABSTRACT

A method of similarity-based deduplication comprising the steps of: receiving an input data block; computing discrete wavelet transform (DWT) coefficients; extracting feature-related DWT data from the computed DWT coefficients; applying quantization to the extracted feature-related DWT data to obtain keys as results of the quantization; constructing a locality-sensitive fingerprint of the input data block; computing a similarity degree between the locality-sensitive fingerprint of the input data block and a locality-sensitive fingerprint of each data block in the plurality of the data blocks in a cache memory; selecting an optimal reference data block as the data block; determining a differential compression is required to be applied based on the similarity degree between the input data block and the optimal refer- (Continued)

ence data block; applying the differential compression to the input data block and the optimal reference data block.

18 Claims, 10 Drawing Sheets

(51) Int. Cl.
*G06K 9/62* (2022.01)
*H03M 7/30* (2006.01)
*G06F 3/06* (2006.01)
*G06F 16/174* (2019.01)
*G06F 16/14* (2019.01)

(52) U.S. Cl.
CPC ......... *G06F 17/148* (2013.01); *G06K 9/6245* (2013.01); *H03M 7/3091* (2013.01); *G06F 3/0673* (2013.01); *G06F 16/152* (2019.01); *G06F 16/1748* (2019.01)

(58) Field of Classification Search
CPC .............. G06F 16/152; G06F 16/1748; G06F 12/0895; G06F 2212/401; G06K 9/6245; H03M 7/3091
See application file for complete search history.

(56) References Cited

U.S. PATENT DOCUMENTS

| | | | |
|---|---|---|---|
| 8,290,918 B1 | 10/2012 | Ioffe | |
| 8,411,977 B1 | 4/2013 | Baluja et al. | |
| 8,712,978 B1 | 4/2014 | Shilane et al. | |
| 8,918,390 B1 | 12/2014 | Shilane et al. | |
| 8,965,859 B1 | 2/2015 | Ioffe | |
| 9,514,146 B1 | 12/2016 | Wallace et al. | |
| 2002/0028022 A1* | 3/2002 | Fukuhara | H04N 19/63 382/240 |
| 2006/0088219 A1 | 4/2006 | Zhang et al. | |
| 2009/0055422 A1 | 2/2009 | Williams et al. | |
| 2010/0125553 A1 | 5/2010 | Huang et al. | |
| 2010/0281208 A1 | 11/2010 | Yang | |
| 2011/0276781 A1 | 11/2011 | Sengupta et al. | |
| 2012/0016845 A1 | 1/2012 | Bates | |
| 2012/0137059 A1* | 5/2012 | Yang | G06F 3/068 711/E12.008 |
| 2012/0137061 A1* | 5/2012 | Yang | G06F 3/0616 711/E12.008 |
| 2012/0144098 A1* | 6/2012 | Yang | G06F 3/068 711/112 |
| 2013/0243190 A1* | 9/2013 | Yang | G06F 3/0616 380/44 |
| 2015/0010143 A1* | 1/2015 | Yang | G06F 3/068 380/28 |
| 2015/0019506 A1 | 1/2015 | Aronovich | |
| 2017/0026665 A1 | 1/2017 | Duan et al. | |
| 2017/0052895 A1* | 2/2017 | Yang | G06F 12/0866 |
| 2018/0052904 A1* | 2/2018 | Fusco | G06F 16/9535 |

FOREIGN PATENT DOCUMENTS

| | | | | |
|---|---|---|---|---|
| CN | 102246137 A | 11/2011 | | |
| CN | 103403710 A | 11/2013 | | |
| CN | 104778689 A | 7/2015 | | |
| CN | 104918046 A | 9/2015 | | |
| CN | 106131575 A | 11/2016 | | |
| WO | 2012109145 A2 | 8/2012 | | |
| WO | WO 2012/109145 A2 * | 8/2012 | ............. | G06F 12/00 |

OTHER PUBLICATIONS

Singh, "Understanding Data Deduplication," http://www.druva.com/blog/understanding-data-deduplication/, Druva (Jan. 9, 2009).
"Signal processing," https://en.wikipedia.org/w/index.php?title=Signal_processing&oldid=911113896, Wikipedia (last visited Aug. 29, 2019).
"Wavelet transform," https://en.wikipedia.org/w/index php?title=Wavelet_transform&oldid=900879949, Wikipedia (last visited Aug. 29, 2019).
"Data deduplication," https://en.wikipedia.org/w/index.php?title=Data deduplication&oldid=910831910, Wikipedia (last visited Aug. 29, 2019).
"Discrete wavelet transform," https://en.wikipedia.org/w/index.php?title=Discrete_wavelet_transform&oldid=912776893, Wikipedia (last visited Aug. 29, 2019).
"Haar wavelet," https://en.wikipedia.org/w/index.php?title=Haar_wavelet&oldid=877612973, Wikipedia (last visited Aug. 29, 2019).
"Daubechies wavelet," https://en.wikipedia.org/w/index.php?title=Daubechies_wavelet&oldid=906694828 (last visited Aug. 29, 2019).
"Fourier transform," https://en.wikipedia.org/w/index.php?title=Fourier_transform&oldid=912445216, Wikipedia (last visited Aug. 29, 2019).
"N-gram," https://en.wikipedia.org/w/index.php?title=N-gram&oldid=912785909, Wikipedia (last visited Aug. 29, 2019).
"Collision (computer science)," https://en.wikipedia.org/w/index.php?title=Collision_(computer_science)&oldid=891440936, Wikipedia (last visited Aug. 29, 2019).
"Hash function," https://en.wikipedia.org/w/index.php?title=Hash_function&oldid=912573906, Wikipedia (last visited Aug. 29, 2019).
"Quantization (signal processing)," https://en.wikipedia.org/w/index.php?title=Quantization_(signal_processing)&oldid=898476304, Wikipedia (last visited Aug. 29, 2019).
"Rounding," https://en.wikipedia.org/w/index.php?title=Rounding&oldid=912416093, Wikipedia (last visited Aug. 29, 2019).
"Truncation," https://en.wikipedia.org/w/index.php?title=Truncation&oldid=781860777, Wikipedia (last visited Aug. 29, 2019).
"Norm (mathematics)," https://en.wikipedia.org/w/index.php?title=Norm_(mathematics)&oldid=910201981, Wikipedia (last visited Aug. 29, 2019).
"Metric (mathematics)," https://en.wikipedia.org/w/index.php?title=Metric_(mathematics)&oldid=910965963, Wikipedia (last visited Aug. 29, 2019).

* cited by examiner

| Position | 1 | 2 | ... | 8191 | 8192 |
|---|---|---|---|---|---|
| Value | X1 | X2 | ... | X8191 | X8192 |

FIG. 7A

| Position | 1 | 2 | ... | 8191 | 8192 |
|---|---|---|---|---|---|
| DWT coefficient | Coeff1 | Coeff2 | ... | Coeff8191 | Coeff8192 |

FIG. 7B

| Selected coefficients | Coeff1 | Coeff2 | Coeff3 | Coeff4 | Coeff5 | Coeff6 |
|---|---|---|---|---|---|---|
| Positions of the selected coefficients | Pos1 | Pos2 | Pos3 | Pos4 | Pos5 | Pos6 |

FIG. 7C

| CoeffKey1 | PosKey1 | CoeffKey2 | PosKey2 | CoeffKey3 | PosKey3 | CoeffKey4 | PosKey4 | CoeffKey5 | PosKey5 | CoeffKey6 | PosKey6 |
|---|---|---|---|---|---|---|---|---|---|---|---|

| Coeff Key1 | PosKey1 | Coeff Key2 | PosKey2 | CoeffKey3 | PosKey3 | CoeffKey4 | PosKey4 | CoeffKey5 | PosKey5 | CoeffKey6 | PosKey6 |
|---|---|---|---|---|---|---|---|---|---|---|---|

FIG. 9A

| Position | 1 | 2 | ... | Pos1 | ... | Pos2 | Pos3 | ... | Pos6 | ... | 8192 |
|---|---|---|---|---|---|---|---|---|---|---|---|
| DWT coefficient | 0 | 0 | 0 | Coeff 1 | 0 | Coeff 2 | Coeff 3 | 0 | Coeff6 | 0 | 0 |

| Type of data | Compression ratio |
|---|---|
| Index files | 3.3 |
| Oracle database | 2.6 |
| MySQL database | 1.7 |

METHOD AND SYSTEM OF SIMILARITY-BASED DEDUPLICATION

CROSS-REFERENCE TO RELATED APPLICATIONS

This application is a continuation of International Application No. PCT/RU2016/000888, filed on Dec. 15, 2016, the disclosure of which is hereby incorporated by reference in its entirety.

TECHNICAL FIELD

The present disclosure relates to a method of similarity-based deduplication and a similarity-based deduplication system.

The present disclosure also relates to a computer-readable storage medium storing program code, the program code comprising instructions for carrying out such a method.

BACKGROUND

Traditional identity-based data deduplication is a technique for eliminating duplicate copies of repeating data. It can be applied to storage systems to improve the storage utilization and can also be applied to network data transfers to improve throughput. Typical deduplication process searches for duplicate data blocks. In case of a storage system, traditional deduplication can save space by substituting duplicated portion of data with a hard link to an identical portion of data already stored in the system. Hard-link-like techniques can give a good space gain when dealing with small blocks of data.

One of the disadvantages of traditional identity-based data deduplication is that only exact matches between data blocks are found. For backup applications this means that if a data block was slightly modified, then the deduplication system will not find a match for this block. Therefore, for some data, even if there are many similarities between data blocks, the advantage of identity-based deduplication may be not very significant.

Another typical requirement for a deduplication system is to provide dynamic deduplication, i.e. to enable finding similar data blocks for a given input data block in real time. Real time deduplication is possible only if determining whether an incoming data block is similar to another data block that was backed up previously (and typically kept in cache) is performed with sufficient speed. To provide a real time deduplication traditional identity-based deduplication methods usually require a large in-memory cache of data to give a good compression rate. Thus it is not applicable to situations when the memory is limited.

SUMMARY

The objective of the present disclosure is to provide a method of similarity-based deduplication and a similarity-based deduplication system for solving the problem of selection of a locality-sensitive hashing (LSH) method suitable for similarity-based data deduplication, wherein the method of similarity-based deduplication and the similarity-based deduplication system overcome one or more of the above-mentioned problems of the prior art. A proposed locality-sensitive hashing method provides the advantages of high speed computation and high similarity detection rates, while requiring small amount of memory for cache.

The foregoing and other objects are achieved by the features of the independent claims. Further implementation forms are apparent from the dependent claims, the description and the figures.

A first aspect of the disclosure provides a method of similarity-based deduplication, comprising the steps of: receiving an input data block; computing discrete wavelet transform, DWT, coefficients based on the input data block; extracting feature-related DWT data from the computed DWT coefficients; applying quantization to the extracted feature-related DWT data to obtain keys as results of the quantization; constructing a locality-sensitive fingerprint of the input data block based on the keys; computing a similarity degree between the locality-sensitive fingerprint of the input data block and a locality-sensitive fingerprint of each data block in the plurality of the data blocks in a cache memory; selecting an optimal reference data block as the data block which has the biggest similarity degree with the input data block among all data blocks in the cache memory; determining whether a differential compression is required to be applied based on the similarity degree between the input data block and the optimal reference data block; and if the differential compression is required, applying the differential compression to the input data block and the optimal reference data block. The differential compression represents an algorithm that allows the contents of two files to be synchronized by communicating only the differences between them. In particular, a differential compression is a lossless compression method that computes a difference between two binary data blocks. This provides higher compression rate in comparison with the traditional identity-based data deduplication using exact matches search.

The method of similarity-based deduplication of the first aspect allows decreasing memory consumption while balancing time complexity and the quality of similarity detection.

The methods according to the first aspect of the disclosure can be performed by a computer-readable storage medium according to the second aspect of the disclosure. Further features or implementations of the method according to the first aspect of the disclosure can perform the functionality of a similarity-based deduplication system according to the third aspect of the disclosure and its different implementation forms.

In a first implementation of the method of similarity-based deduplication according to the first aspect, the method further comprises, if no differential compression is required: determining based on the similarity degree between the input data block and the optimal reference data block whether a traditional single-block compression is required; and if the traditional single-block compression is required, applying the traditional single-block compression to the input data block. The traditional single-block compression represents a data compression of a single input data block using any traditional compression procedures known to the skilled person. Applying a single-block compression to those data block for which no differential compression is required provides increasing of a total compression ratio showing the reduction of data size produced by a data deduplication system and decreased data consumption as a result.

In a second implementation of the method of similarity-based deduplication according to the first aspect as such or according to the first implementation of the first aspect, computing the similarity degree between the locality-sensitive fingerprints comprises: reconstructing DWT coefficients from the locality-sensitive fingerprints; computing a distance between series of the reconstructed DWT coefficients, wherein each series of the reconstructed DWT coefficients is represented by a vector; and determining the similarity degree as an inverse to the computed distance. This implementation uses computing the similarity degree between the locality-sensitive fingerprints instead of computing the similarity between data block themselves. Computing the similarity degree between the locality-sensitive fingerprints is far more computationally easier than estimating the similarity between the large data blocks. Besides, the similarity degree based on the locality-sensitive fingerprints has been shown to have a stable correlation with the similarity measure computed by direct comparison of data blocks (without going to fingerprints first). This makes it possible to achieve close-to-optimal compression ratio in many scenarios.

In a third implementation of the method of similarity-based deduplication according to the second implementation of the first aspect, computing the similarity degree between the locality-sensitive fingerprints further comprises an additional step of applying a reverse discrete wavelet transform to the reconstructed DWT coefficients to reconstruct data; wherein a distance is computed between series of the reconstructed data. This step is not compulsory and may be omitted. Applying of an additional step of a reverse discrete wavelet transform increases correlation accuracy between the similarity degree based on the locality-sensitive fingerprints and the similarity measure computed by direct comparison of data blocks.

In a fourth implementation of the method of similarity-based deduplication according to the first aspect as such or according to any of the preceding implementations of the first aspect, the locality-sensitive fingerprints of the plurality of the data blocks in the cache memory are pre-computed. Storing the pre-computed locality-sensitive fingerprints in the cache memory excludes the necessity of their calculation upon performing a similarity-based deduplication, therefore the speed of processing is increased and the processing time is decreased correspondingly.

In a fifth implementation of the method of similarity-based deduplication according to the first aspect as such or according to any of the preceding implementations of the first aspect, determining whether a differential compression is required comprises: receiving a previously computed similarity degree between the input data block and the optimal reference data block; comparing the similarity degree with a threshold; determining the differential compression is required, if the similarity degree is above the threshold. Comparing the similarity degree with the threshold is the most sufficient way of decision making on the similarity between two data blocks which could be possibly used for the differential compression.

In a sixth implementation of the method of similarity-based deduplication according to the fifth implementation of the first aspect, the threshold is pre-defined or defined dynamically to regulate the number of the data blocks to apply compression to. By dynamic regulation of the threshold the number of the data blocks to apply compression to may be regulated and the desired compression ration may be obtained.

In a seventh implementation of the method of similarity-based deduplication according to the first aspect as such or according to any of the preceding implementations of the first aspect, the method further comprises preprocessing of the input data block prior to computing the DWT coefficients and applying a wavelet transformation to the preprocessed input data block to compute the DWT coefficients, wherein preprocessing of the input data block includes one of: computing a histogram of n-grams of the input data block, computing a reduced histogram of n-grams of the input data block, computing a histogram of hashes of n-grams of the input data block, or computing a reduced histogram of hashes of n-grams of the input data block, wherein n-gram denotes a continuous sequence of length n, n≥1, of the input data block. Preprocessing of the data block is performed to improve the quality of the locality-sensitive fingerprint and to improve the overall quality of the deduplication system correspondingly. The aim of preprocessing is to transform the initial data in a way that extracts some important features that can increase the quality of similarity detection.

In an eighth implementation of the method of similarity-based deduplication according to the seventh implementation of the first aspect, reordering or sorting is applied to the results of preprocessing and applying a wavelet transformation is applied to the reordered or sorted preprocessed input data block to compute the DWT coefficients. Sorting the data can improve the quality of wavelet transforms.

In a ninth implementation of the method of similarity-based deduplication according to the first aspect as such or according to any of the preceding implementations of the first aspect, the feature-related DWT data are extracted based at least on one of: values of first N coefficients, values of N coefficients with maximum magnitude, positions of N coefficients with maximum magnitude, or both values and positions of N coefficients with maximum magnitude. N is predetermined for the whole deduplication system. All these alternative methods provide extracting information that can be effectively used in future similarity analysis, e.g. information that encodes most frequent subsequences in data. Different products can choose different values of N. The value of N can be chosen on the stage of developing or testing of the deduplication system and not change during the lifetime of the system. Larger values of N give better similarity detection (i.e. better compression rate). Smaller numbers of N give high computation speed. The experiments have shown that N=8 can give a good balance between speed and compression rate for many use cases.

In a tenth implementation of the method of similarity-based deduplication according to the first aspect as such or according to any of the preceding implementations of the first aspect, the method further comprises determining whether the input data block should be stored in the cache memory and/or if any data block should be removed from the cache memory based on statistics of use of data blocks in the differential compression; and adding the input data block to the cache memory and/or removing data blocks from the cache memory. This implementation provides avoiding maintaining an excessive data block number in the cache memory and balancing cache memory volume required and sufficient amount of the data blocks store for further use in a similarity-based deduplication.

A second aspect of the disclosure refers to a a computer-readable storage medium storing program code, the program code comprising instructions for carrying out the method of the first aspect or one of the implementations of the first aspect.

A third aspect of the disclosure refers to a similarity-based deduplication system, comprising: an input module configured to receive an input data block; a cache memory configured to store data blocks; a computational module configured to: compute discrete wavelet transform, DWT, coefficients based on the input data block; extract feature-related DWT data from the computed DWT coefficients; apply quantization to the extracted feature-related DWT data to receive keys as results of the quantization; construct a locality-sensitive fingerprint of the input data block based on the keys; and a decision module configured to: compute a similarity degree between the locality-sensitive fingerprint of the input data block and a locality-sensitive fingerprint of each data block in the plurality of the data blocks in the cache memory; select the optimal reference data block such as the similarity degree is the biggest among all blocks in the plurality of the data blocks in the cache memory; and determine whether a differential compression is required to be applied based on the input data block and the optimal reference data block; and a compression module configured to apply the differential compression to the input data block and the optimal reference data block.

In a first implementation of the similarity-based deduplication system of the third aspect, the decision module is further configured to, if no differential compression is required: determine based on the similarity degree whether a traditional single-block compression is required; and the compression module is further configured to apply the traditional single-block compression to the input data block, if the traditional single-block compression is required.

In a third implementation of the similarity-based deduplication system of the third aspect as such or according to the first implementation of the third aspect, the decision module is further configured to determine whether the input data block should be stored in the cache memory and/or if any data block should be removed from the cache memory based on statistics of use of data blocks in the differential compression.

All the implementations of the first aspect may be easily combined and used together with all the implementations of the third aspect.

These and other aspects of the disclosure will be apparent from the embodiments described below.

BRIEF DESCRIPTION OF THE DRAWINGS

To illustrate the technical features of embodiments of the present disclosure more clearly, the accompanying drawings provided for describing the embodiments are introduced briefly in the following. The accompanying drawings in the following description are merely some embodiments of the present disclosure, modifications on these embodiments are possible without departing from the scope of the present disclosure as defined in the claims.

DETAILED DESCRIPTION

The foregoing descriptions are only implementation manners of the present disclosure, the scope of the present disclosure is not limited to this. Any variations or replacements can be easily made through person skilled in the art. Therefore, the protection scope of the present disclosure should be subject to the protection scope of the attached claims.

Figure 1:
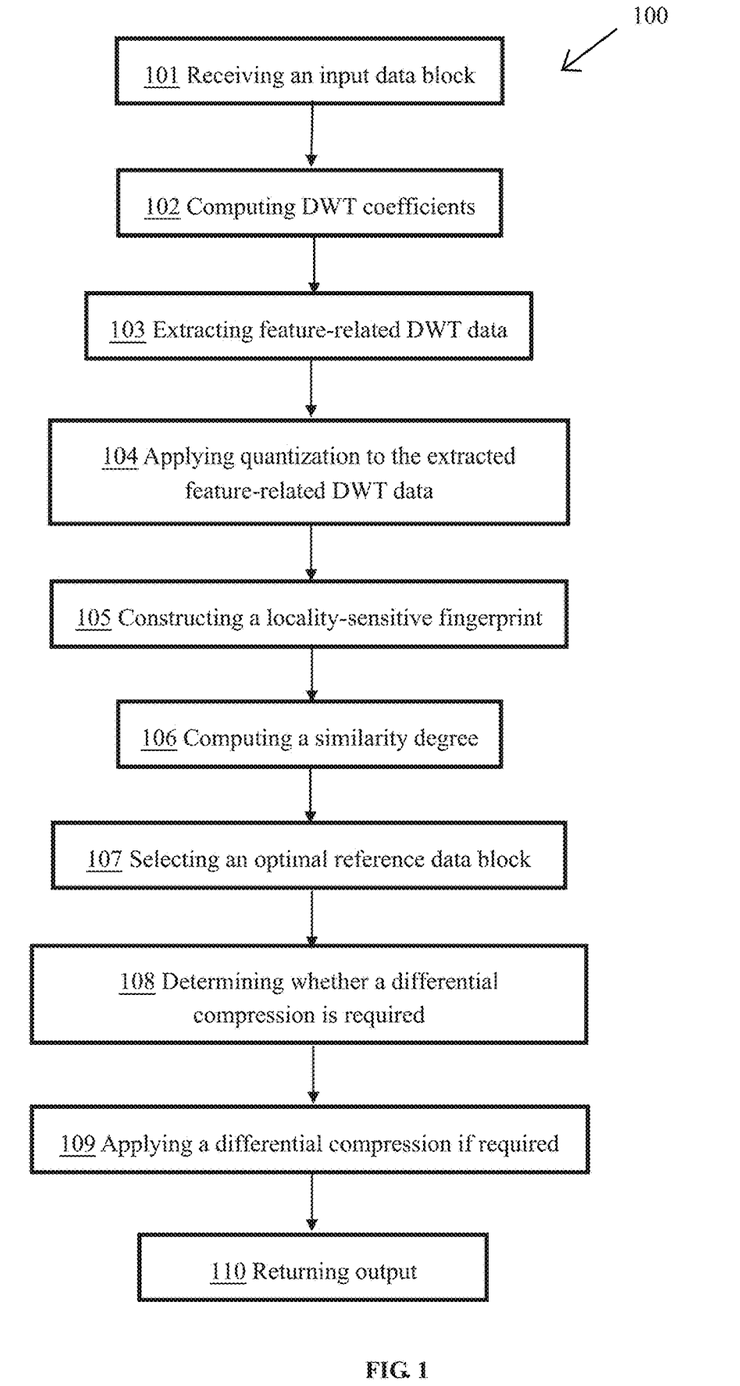
FIG. 1 is a flow chart of a method of similarity-based deduplication in accordance with an embodiment of the present disclosure.

FIG. 1 illustrates a method 100 of similarity-based deduplication in accordance with the first aspect of the disclosure. The method starts at block 101, where an input data block is received. At step 102 discrete wavelet transform (DWT) coefficients are computed based on the input data block. At step 103 feature-related DWT data are extracted from the computed DWT coefficients and quantization is applied (step 104) to the extracted feature-related DWT data to obtain keys as results of the quantization. Based on the obtained keys a locality-sensitive fingerprint of the input data block is constructed at step 105 and a similarity degree between the locality-sensitive fingerprint of the input data block and a locality-sensitive fingerprint of each data block in the plurality of the data blocks in a cache memory is computed at step 106. The similarity degree may be stored in a temporary memory during the search phase and removed from the memory when the search is finished. Selecting an optimal reference data block is performed at step 107 based on the computed similarity degree. The data block which has the biggest similarity degree with the input data block among all data blocks in the cache memory is selected as the optimal reference data block. Based on the similarity degree between the input data block and the optimal reference data block it is further determined at step 108 whether a differential compression is required to be applied. If the differential compression is required, the differential compression is applied (step 109) to the input data block and the optimal reference data block.

Figure 2:
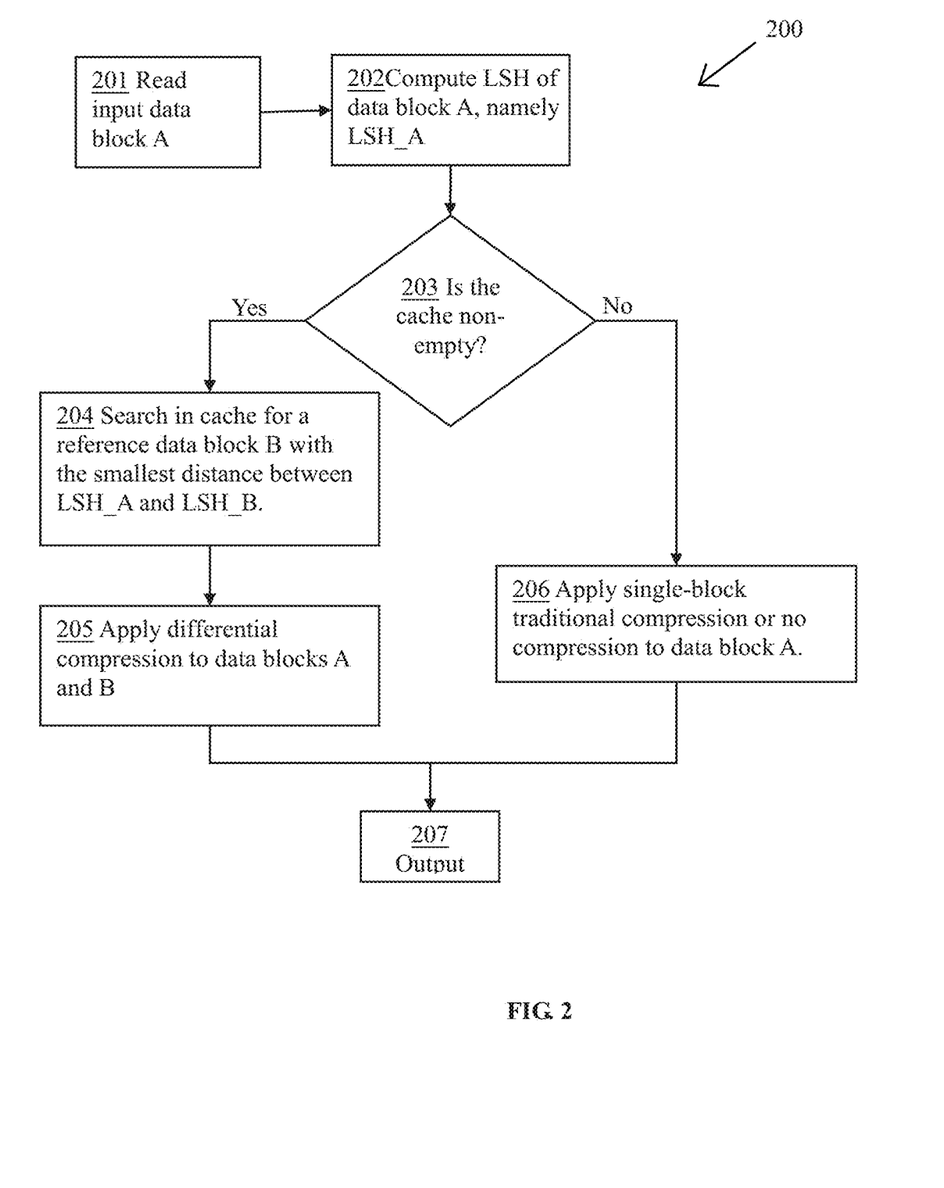
FIG. 2 is a flow chart of a deduplication procedure that uses the locality-sensitive fingerprints in accordance with a further embodiment of the present disclosure.

FIG. 2 illustrates the deduplication procedure 200 that uses the locality-sensitive fingerprints proposed in this disclosure. Data deduplication is used in the meaning of eliminating duplicate copies of repeating data. Similarity-based deduplication is used in the meaning of compression that exploits data resemblance. An input block A is read at step 201. Then the locality-sensitive fingerprint LSH_A of the input block A is computed (step 202). Then it is checked whether the cache is non-empty at step 203. If the cache is non-empty, a reference data block B is selected from the cache to be possibly used for differential compression. It is then decided what kind of compression to apply: differential compression, single-block traditional compression, or no compression. If needed the differential compression is applied (step 205). A differential compression is a lossless compression method that computes a difference between two binary data blocks. If at step 203 it is determined than the cash is empty a traditional single-block compression or no compression is applied to the data block A (step 206). The procedure ends at step 207 by outputting the compression result.

One method to select a reference data block is to search in the cache for a reference block B such that the value, being an inverse value of the similarity degree between LSH_A and LSH_B, is the smallest among all blocks B in the cache, as shown at step 204 in FIG. 2. Similarity degree (similarity measure is a number that shows how much two data blocks are similar. Similarity detection procedure is a procedure that detects if two portions of data are similar or not. This search can be performed by traversing all blocks B in cache and computing the inverse value of the similarity degree between LSH_A and LSH_B. LSH fingerprints for blocks in cache are normally kept pre-computed. Alternatively, hash-table-like data structures can be used to speed-up the search time. The exact searching method is not relevant for this disclosure.

Herein and further throughout the description a fingerprint is a small fixed-size data. A locality sensitive hashing (LSH) is a hashing method that preserves locality of data, i.e. if two data blocks, A and B, have similar LSH fingerprints, then A and B are similar. When dealing with LSH hashing, two similarity measures must be defined: one for data blocks, and the second—for LSH fingerprints. Whereas hashing generally us a method to compute a fixed-size fingerprint from a block of data of an arbitrary length.

Figure 3:
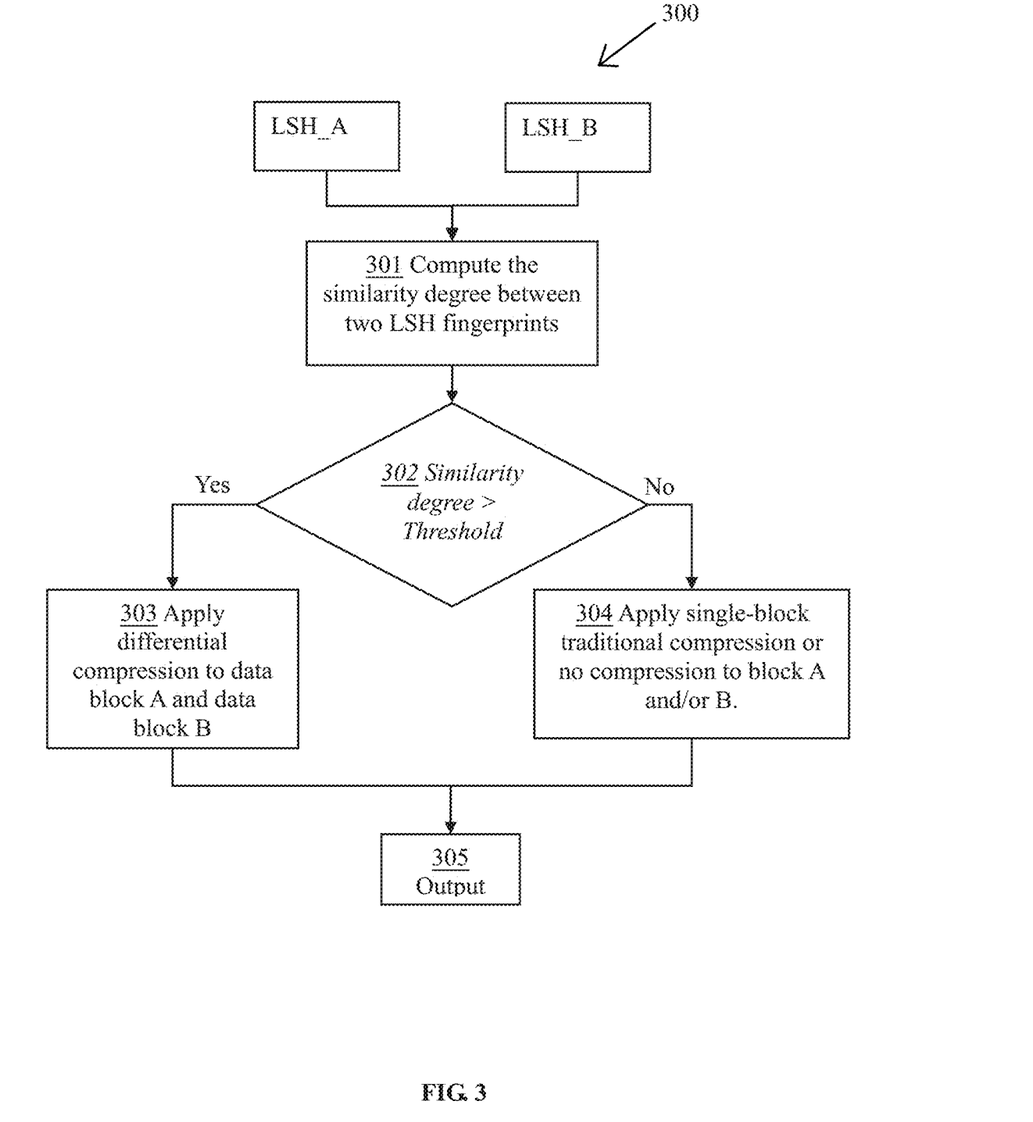
FIG. 3 is a flow chart of a method to decide what kind of compression to apply in accordance with a further embodiment of the present disclosure.

FIG. 3 illustrates a method 300 to decide what kind of compression to apply. The similarity degree between the locality-sensitive fingerprint LSH_A of the input block A and the locality-sensitive fingerprint LSH_B of a candidate block B is computed at step 301. At step 302 the similarity degree between the input block A and a candidate block B is compared with some threshold Threshold. The threshold can be pre-defined or defined dynamically to regulate the number of blocks to apply compression to. The differential compression is applied (step 303) to the data block A and the data block B, if the similarity degree is above the threshold. If the similarity degree is below the threshold, a traditional single-block compression or no compression is applied (step 304) to one of the data blocks A and B or to both. The method ends at step 305 by outputting the compression result.

Figure 4:
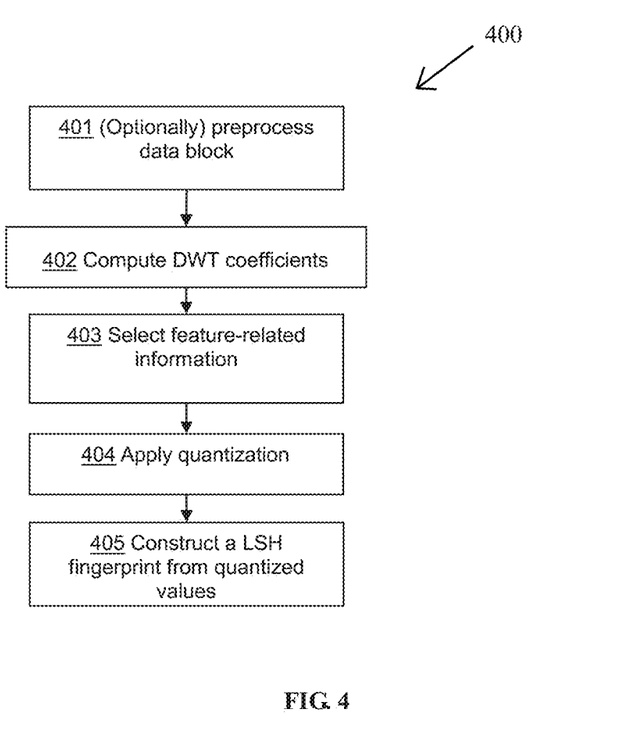
FIG. 4 is a flow chart of a procedure of computation of locality-sensitive fingerprint of a data block, shown on FIG. 2, in accordance with a further embodiment of the present disclosure.

FIG. 4 illustrates a procedure 400 of computation of locality-sensitive fingerprint of a data block performed at step 202 shown on FIG. 2. The procedure starts with computing DWT coefficients at step 402. DWT coefficients represent a result of discrete wavelet transform (a sequence of real numbers). The discrete wavelet transform (DWT) is a variant of wavelet transform that can be applied to discrete time series, where the wavelet transform is a type of data sequence transformation that uses wavelets. It transforms the initial data block to a sequence of coefficients (real-numbers). An optional and non-compulsory preprocessing (step 401) of the data block may be provided prior to computing DWT coefficients. After DWT coefficients are computed the feature-related items (data, information) is selected (extracted) (step 403) from the computed DWT coefficients. The selected feature-related items are quantized at step 404 and a locality-sensitive (LSH) fingerprint of the data block is constructed (step 405) from quantized values.

The proposed idea of a locality-sensitive fingerprint is to use a signal-processing method to a block of data to extract information relevant for similarity analysis. The locality-sensitive hashing is based on discrete wavelet transform. Wavelet transform is a linear data sequence transformation that locates features not only in frequency domain but in time domain as well. Wavelet transform is believed to be one of the most advanced features extraction techniques.

Discrete wavelet transform (DWT) is a discrete version of general wavelet transformation. It can be applied to discrete time series of arbitrary nature and length. For a given data sequence, DWT provides a vector of decomposition coefficients. Each coefficient carries information about feature strength. Its index carries information about feature position and scale in original data vector. This way, DWT coefficients give us the knowledge about the data features. One of the best options for a DWT is to use Haar transform. Other options may use Daubechies transform or Fourier transform or their algorithms variations.

The most straightforward method to compute DWT coefficients is performed in the following way. The initial data block is treated as a sequence of N integer numbers (e.g. each byte can be treated as an integer from 0 to 255; another option is to treat each pair of sequent bytes as an integer from 0 to 65535). Then discrete wavelet transform is applied to that sequence of N integer numbers. This transformation will produce a sequence of N real values (DWT coefficients). These coefficients will be used later to construct an LSH fingerprint out of them.

Figure 5:
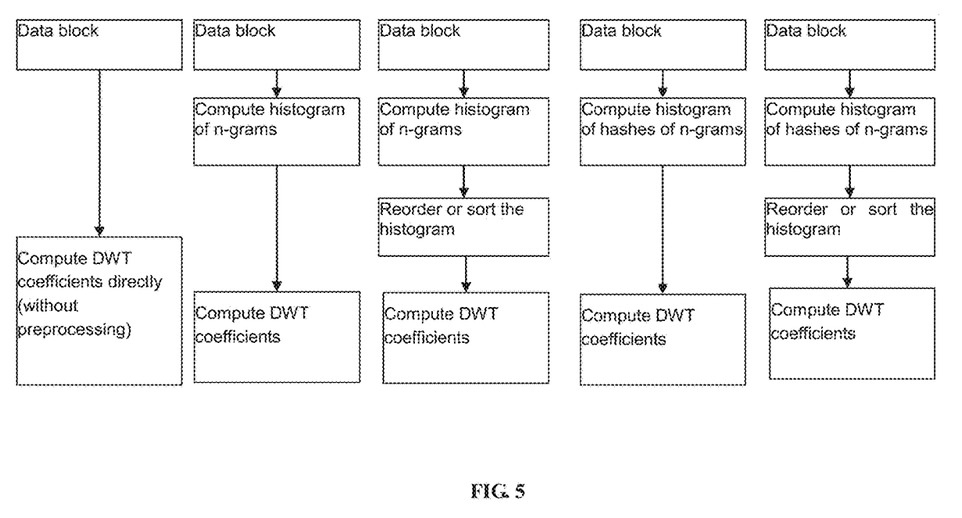
FIG. 5 shows some options to preprocess a data block and compute DWT coefficients in accordance with a further embodiment of the present disclosure.

Preprocessing is an optional step that can improve the overall quality of deduplication system. It is performed before the application of discrete-wavelet transform. The aim of preprocessing is to transform the initial data in a way that extracts some important features that can increase the quality of similarity detection. A good option for preprocessing is to compute a histogram of n-grams or a histogram of hashes of n-grams of the initial data block. FIG. 5 shows some options to preprocess a data block and compute DWT coefficients (including a "no-preprocessing" option already discussed above).

By n-gram a continuous subsequence of length n of some data block B is meant. Different values of n can be used: n=1, n=2, n=3, n=4, n=5 can be a good selection; larger values of n are also possible. If n=1, then 1-gram is called "unigram"; if n=2, then 2-gram is called "bigram". If a data block has length N bytes, then there are (N−n+1) subsequent of length n, some of them may coincide. The total number of all possible sequences of n-bytes is $256^n$. If all $256^n$ sequences of n-bytes are ordered, then a histogram on n-grams can be computed.

A histogram of n-grams is a vector a(1), a(2), . . . a($256^n$) of non-negative integer numbers, called frequencies, where a(k) is the number of times that n-gram with number k occurred in the initial data block B as a subsequence. If the length N of the initial data block B is large enough, then most of a(k) will be equal to zero. For this reason, all $256^n$ frequency numbers are not kept in the memory; instead, the frequencies b(1), b(2), . . . , b(S) for those n-grams that appear as a subsequences of the initial N-byte data block (1<=S<=N−n+1) can be kept in the memory. The sequence b(1), b(2), . . . , b(s) is called a reduced histogram. Example of a reduced histogram of n-grams for S=10 is shown on FIG. 6.

Figure 6:
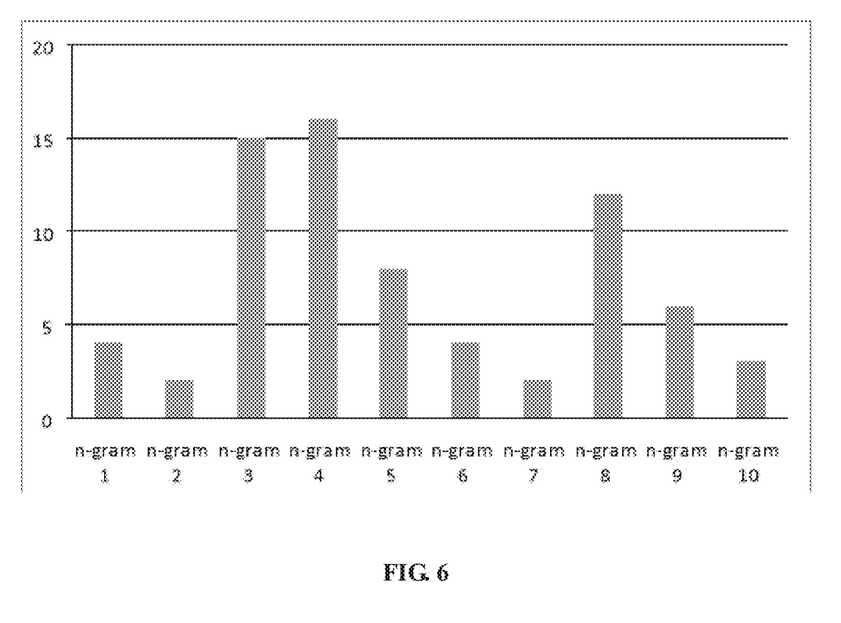
FIG. 6 shows a reduced histogram received as a result of preprocessing shown in FIG. 5, FIGS. 7A-7D show a method of computation of a LSH fingerprint in accordance with an embodiment of the present disclosure.

The reduced histogram b(1), b(2), . . . , b(S) can be treated as a result of a preprocessing step. After it has been computed, the procedure follows to the next step—discrete wavelet transform is applied to the sequence b(1), b(2), . . . , b(S). As a result, a sequence of S real values (DWT coefficients) is obtained. It is also possible to apply DWT to the histogram a(1), a(2), . . . a($256^n$) itself.

Another method to preprocess a data block is first to compute a reduced histogram b(1), b(2), . . . , b(S) of n-grams (for some n), and then to reorder the preprocessed histogram (e.g. in an ascending order), making another histogram b'(1), b'(2), . . . , b'(S), where b'(1)<=b'(2)<= . . . <=b'(S). Then discrete wavelet transform is then applied to the reordered reduced histogram b'(1), b'(2), . . . , b'(S).

Another method to preprocess a data block is to use a histogram of hashes of n-grams. A histogram of hashes of n-grams is a vector a(1), a(2), . . . , a(S) of fixed size S, where S is usually a power of 2, i.e. $S=2^K$ (for some K). It differs from the ordinary histogram of n-grams in that for histogram of hashes one first computes a hash function of an n-gram and counts the number of occurrences of a given hash-value. Histograms of hashes of n-grams have an advantage that there can have a variable fixe size; however, the disadvantage is that hash collisions are possible, thus reducing the quality of similarity detection. Any kind of hash functions can be used to compute a histogram of hashes of n-grams.

Additionally, after preprocessing a data block, one can reorder the result of a preprocessing (a fixed reordering can be used, or a sorting can be used). Sometimes, sorting the data can improve the quality of wavelet transforms.

The aim of selecting feature-related information shown by step 403 in FIG. 4 is to extract the most valuable information from DWT coefficients computed on the previous step. The most valuable information in this case means information that can be effectively used in future similarity analysis, e.g. information that encodes most frequent subsequences in data.

Given a sequence c(1), c(2), . . . , c(S) of DWT coefficients computed on the previous step, the following methods to extract feature-related information may be used:

1. Selecting values of first M coefficients, i.e. c(1), c(2), . . . , c(M) for some M<=S. M=8 can be a good fit; other values of M are also possible;
2. Selecting values of top M coefficients with largest absolute values, i.e. c(pos_1), c(pos_2), . . . , c(pos_M) where pos_1, pos_2, . . . , pos_M are positions of top M coefficients with largest absolute values;
3. Selecting positions pos_1, pos_2, . . . , pos_M of M coefficients with largest absolute values;
4. Selecting both values and positions for M coefficients with largest absolute values, i.e. pos_1, c(pos_1), pos_2, c(pos_2), . . . , pos_M, c(pos_M).

After some feature-related DWT coefficients c_1, c_2, . . . , c_M have been selected using one of the methods mentioned above (or a combination of those methods), a fingerprint may be construed out of them as shown in step 405 in FIG. 4. There are many options of how to do this. First of all, c_1, c_2, . . . , c_M are real numbers. In order to make a fingerprint shorter quantization technique may be optionally applied to reduce the information stored in real numbers c_1, c_2, . . . , c_M, as shown in step 404 in FIG. 4.

Quantization is a method of mapping real numbers into an integer or real numbers with limited precision. The aim of quantization is to map a real number into a fixed-precision value. The precision is usually pre-determined and it can be defined as a number of bits available to map an integer or real number onto. Examples for quantization are rounding and truncation.

Quantization can be applied to both DWT coefficients and positions. The results of quantization are referred as keys. Examples of quantization are:

1. Quantization of coefficient value with some factor: Coeff==>key=truncate(Coeff/Factor);
2. Truncation of floating-point mantissa: $X*10^a$==>key= $(X/Factor)*10^a$;
3. Quantization of coefficient positions: Pos==>key=round(Pos/Factor).

Every key is associated with an information capacity, i.e. the number of bits available to be stored in the key:

Key_1 with capacity=Cap_1 bits

Key_2 with capacity=Cap_2 bits

. . .

Key_M with capacity=Cap_M bits

After all keys Key_1, Key_2, . . . , Key_M have been computed, a fingerprint can be constructed out of them. The size of the fingerprint will be equal to the sum of capacities of all keys, i.e. Size_of_fingerprint=Cap_1+Cap_2+ . . . + Cap_M. The fingerprint is obtained by concatenating all keys together into a large bit array.

Figure 7A:
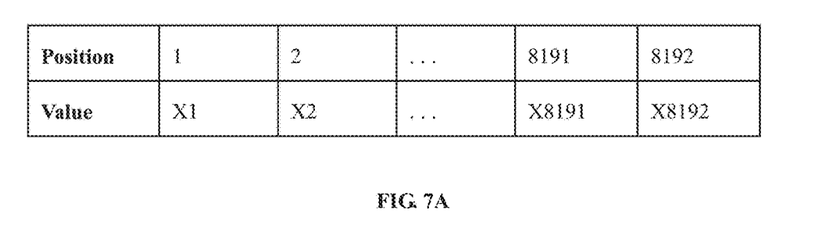
Figure 7B:
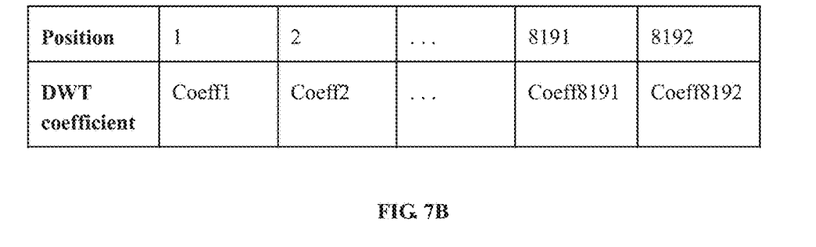
Figure 7C:
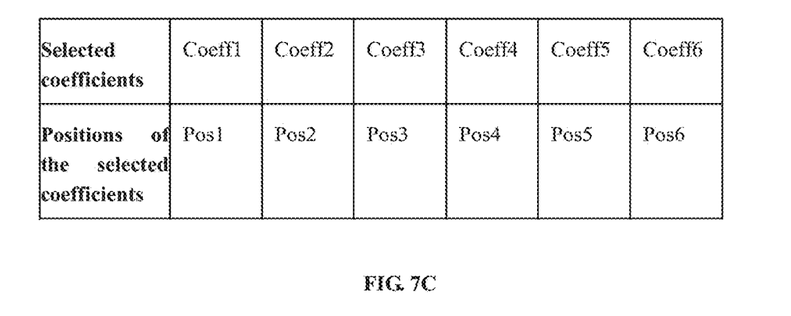

The example of computation of a LSH fingerprint is further described as a consequence of the following steps:

1. If a data block A is an 8 KB data block A it may be considered as a sequence of 8192 numbers X1, X2, . . . , X8192, where each number can take a value between 0 and 255. This is shown in the table in FIG. 7A.
2. Applying discrete wavelet transform to the sequence of numbers shown in FIG. 7A. The wavelet transform will produce 8192 real-value coefficients shown in the table in FIG. 7B.
3. Using method described above, selecting feature-related information from DWT coefficients. In this example, 6 coefficients with largest absolute value and their positions are selected. The result is shown in the table in FIG. 7C.
4. In this example it is intended to fit every coefficient into 8-bit signed integer, CoeffKey. For this reason a quantization of coefficients is performed, the following formula can be used as an example:

CoeffKey=127 if round(Coeff/16)>127;

CoeffKey=round(Coeff/16) if −128<=round(Coeff/ 16)<=127;

CoeffKey=−128 if round(Coeff/16)<−128;

In this example no quantization is applied to the positions, but it is possible to do it if it is desired to make the fingerprint smaller. As long as every position has a value from 0 to 8191, 13 bits are required to store the position number.

PosKey=Key

Figure 7D:
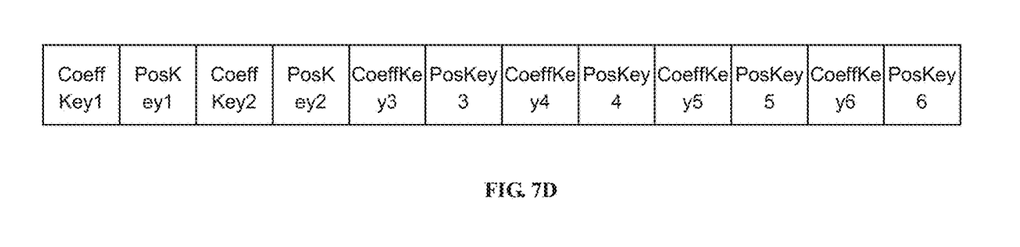

Finally, all 6 8-bit keys (signed integers) and 6 13-bit unsigned integers that encode positions are collected together to make a 126-bit fingerprint. The order in which keys and positions are collected is not relevant, but it should be pre-defined and fixed in order to make it possible to make a reverse transformation. In this example, keys and positions are interleaved. This is shown in the table in FIG. 7D.

It may be required to measure the similarity between two data blocks: given two data blocks, A and B, as for example in step 106 in FIG. 1, where a similarity measure (or degree) Similarity (A, B) between A and B is computed. After the similarity measure has been computed, the deduplication system can decide what kind of the compression to apply to two data blocks: no compression, differential compression, or traditional compression. If the similarity between two data blocks is high enough (according to some predefined criterion that is discussed below), then it is beneficial to apply differential compression to two data blocks. If the similarity between two data blocks is low, then there might be no benefit in applying differential compression; in this case the deduplication system can apply traditional one-block compression algorithms, e.g. DEFLATE, LZF, LZMA, bzip2 and other.

Because in real-world scenarios data blocks can be large, instead of computing the similarity between A and B, a similarity Similarity (LSH_A, LSH_B) between the corresponding LSH fingerprints, LSH_A and LSH_B, can be computed. The method used to compute the similarity between LSH fingerprints is, of course, different from the method used to compute the similarity between data blocks themselves. After we have computed the similarity between two LSH fingerprints, we can make a decision of what kind of compression to apply based the similarity between LSH fingerprints. This can give positive results if and only if there is a good correlation between Similarity (A, B) and Similarity (LSH_A, LSH_B). One of the features of our proposal is that the similarity between fingerprints is indeed a good estimate to the similarity between the data blocks themselves, i.e. if one computes LSH fingerprints using the method described above, then one can make a decision based on the similarity of LSH fingerprints (which is by far computationally easier than to estimate the similarity between the large data blocks).

Figure 8:
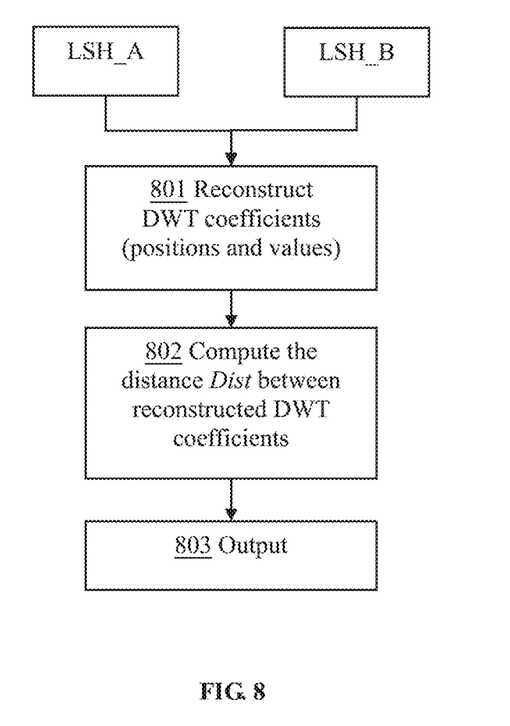
FIG. 8 is a flow chart of a procedure to compute the similarity measure between two fingerprints in accordance with an embodiment of the present disclosure.

FIG. 8 illustrates the procedure to compute the similarity measure between two fingerprints. The procedure consists of the following steps:

1. Reconstruction (step 801) of DWT coefficients from fingerprints, LSH_A and LSH_B;
2. Computation (step 802) of the distance between the reconstructed DWT coefficients obtained on the previous step;
3. Based on the DWT coefficients, decided what kind of the compression to apply: no compression, differential compression, or traditional compression.

We should note that the origin of the LSH fingerprints is not important: one or both data blocks can come from the input stream (with LSH fingerprints being computed immediately), or one or both LSH fingerprints can be already pre-computed and stored in a RAM cache, or disk cache, or other storage. The similarity estimation procedure starts with two LSH fingerprints.

The example of this procedure is further described. Two fingerprints, LSH_A and LSH_B, each of size 126 bits, are given. First, it is required to truncate the fingerprints into keys (positions and/or coefficients). The reconstruction procedure can be considered as the reverser procedure for the construction of LSH fingerprint, for this reason the reconstruction must be consistent with the packing rules used when the fingerprint was constructed. In this example, 6 8-bit keys (signed integers) that encode coefficients and 6 13-bit unsigned integers that encode positions are extracted as shown in the table in FIG. 9A.

Figure 9A:
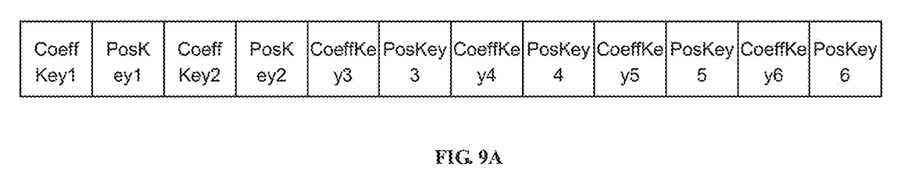
FIGS. 9A-9B show a similarity estimation procedure in accordance with further embodiment of the present disclosure.

As the next step, positions and coefficients from the extracted keys are decoded. As long as positions are packed without truncation, there is no need to apply additional operations for integers that encode positions: Pos=PosKey. However, it may be required to reverse-transform the keys into coefficients, using the following formula:

Coeff=16*CoeffKey (keys are being treated as signed integers)

Thus, 6 positions and coefficients of the original 8192 DWT will be reconstructed. As long as no information regarding other DWT coefficients was stored in LSH fingerprints, it can be assumed that all other DWT coefficients are equal to zero, as may be seen in the table in FIG. 9B.

Figure 9B:
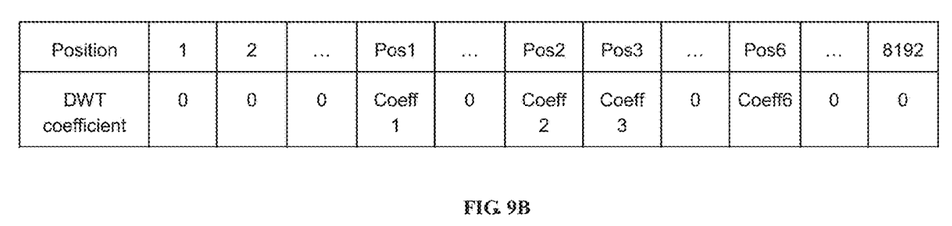

Now, when all 8192 DWT coefficients for two fingerprints (the coefficients having been either reconstructed from the fingerprint or assigned to be zero) are received, one can compute a distance between series of DWT coefficients. To do this, 8192 coefficients are treated as a vector of 8192 real numbers. Several metrics can be applied to compute the distance between two vectors of real numbers, e.g. Manhattan metric, Euclidean metric, p-metric, maximum metric, or other metrics. If LSH fingerprint store positions of DWT coefficients as keys, then alternatively the similarity between two LSH fingerprints can be computed as the number of keys that are present at both fingerprints (and the distance between fingerprints being defined as an inverse to similarity). Experiments have demonstrated that most metrics give similar results with regards to deduplication efficiency.

Figure 10:
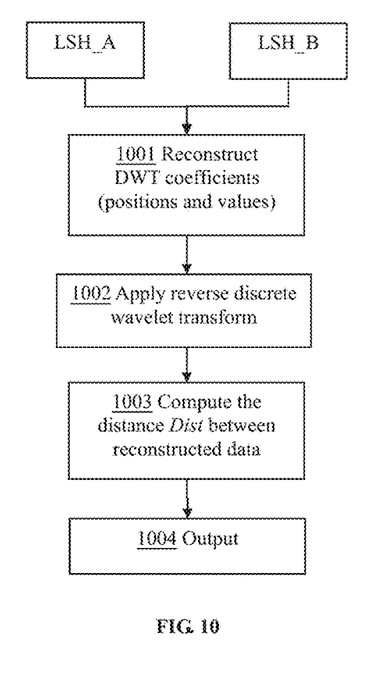
FIG. 10 is a flow chart of a method of computing a similarity between two LSH fingerprints in accordance with further embodiment of the present disclosure.

The alternative method of computing a similarity between two LSH fingerprints is illustrated in FIG. 10. This method additionally applies (step 1002) reverse discrete wavelet transform to DWT coefficients (positions and values) reconstructed at step 1001 to reconstruct either the histograms of n-grams, the histograms of hashes of n-grams, or raw data (depending on the preprocessing method that was used). After that the distance is computed (step 1003) between the reconstructed histogram or raw data, but not between the reconstructed DWT coefficients. The result is outputted at step 1004.

Figure 11:
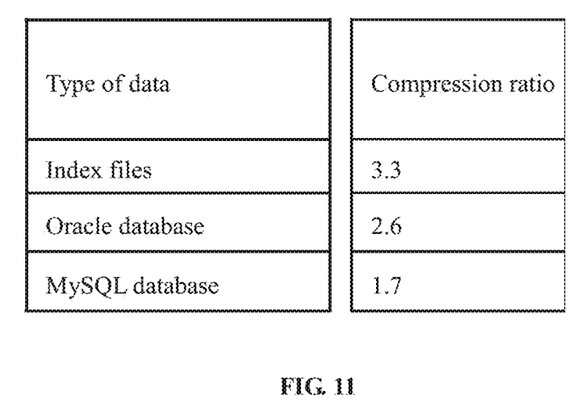
FIG. 11 shows testing results of the method in accordance with the present disclosure.

The testing results of the disclosure are presented in FIG. 11. The total compression ratio shows the reduction of data size produced by a data deduplication system. It is defined as the following ratio:

Compression ratio=(size of uncompressed data)/(size of compressed data).

As long as typical similarity-based data deduplication system supports three types of compression (namely differential compression, single-block compression, and no compression), the size of compressed data can be further clarified as:

size of compressed data=diff_compr_size+single_block_compr_size+no_compr_size, where:
diff_compr_size is the total size of compressed data that was compressed using differential compression;
single_block_compr_size is the total size of compressed data that was compressed using single-block compression;
no_compr_size is the total size of data that was not compressed at all.

The method to compute an LSH fingerprint proposed in this disclosure has the following advantages:

1. The similarity measure based on LSH fingerprints and computed with methods described above has been shown to have a stable correlation with the similarity measure computed by direct comparison of data blocks (without going to fingerprints first). This makes it possible to achieve close-to-optimal compression ratio in many scenarios.

2. The fingerprint size can be customizable. Larger fingerprint sizes give better compression ratio, but decrease the speed. Our experiments have shown that a small number of DWT coefficients (<=32) can be enough for good compression ratio. If a very high speed is required, then the fingerprint size=8 can be used.

3. Small memory footprint. If the deduplication system uses an in-RAM, then the size thereof can be customizable.

Our experiments have shown that for many deduplication scenarios it is sufficient to have a cache size=300 to achieve compression ration close to theoretically optimal—if the methods proposed in this disclosure are used.

Figure 12:
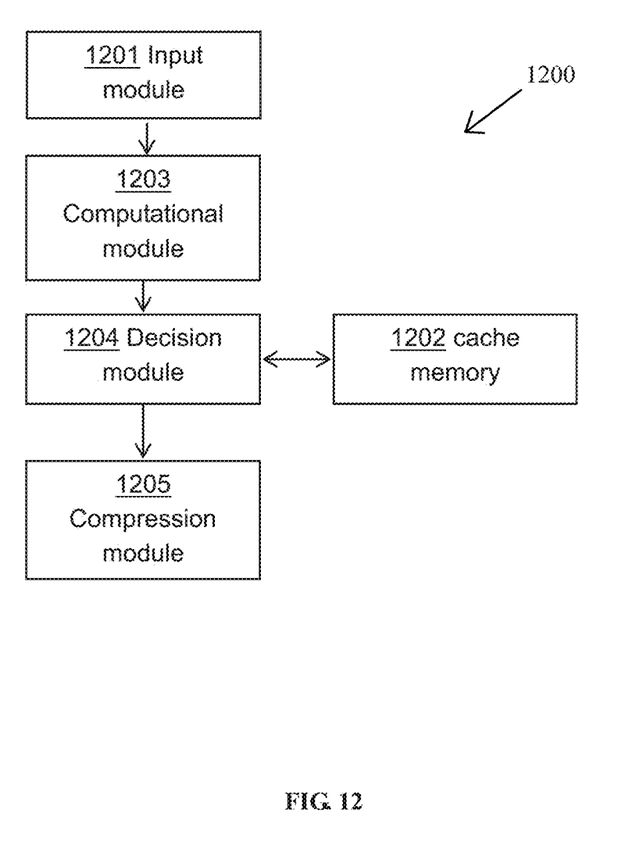
FIG. 12 is a block diagram illustrating a similarity-based deduplication system in accordance with an embodiment of the present disclosure.

FIG. 12 illustrates a similarity-based deduplication system 1200, comprising: an input module 1201, a cache memory 1202, a computational module 1203, a decision module 1204 and a compression module 1205. The input module 1201 is configured to receive an input data block. The cache memory 1202 is configured to store data blocks. The computational module 1203 is configured to: compute DWT coefficients based on the input data block; extract feature-related DWT data from the computed DWT coefficients; apply quantization to the extracted feature-related DWT data to receive keys as results of the quantization; and construct a locality-sensitive fingerprint of the input data block based on the keys. The decision module 1204 is configured to: compute a similarity degree between the locality-sensitive fingerprint of the input data block and a locality-sensitive fingerprint of each data block in the plurality of the data blocks in the cache memory; select the optimal reference data block such as the similarity degree is the biggest among all blocks in the plurality of the data blocks in the cache memory; and determine whether a differential compression is required to be applied based on the input data block and the optimal reference data block. The compression module 1205 is configured to apply the differential compression to the input data block and the optimal reference data block.

What is claimed is:

1. A method for similarity-based deduplication, the method comprising:
   receiving, by a processor, an input data block;
   computing, by the processor, discrete wavelet transform (DWT) coefficients based on the input data block;
   extracting, by the processor, feature-related DWT data from the computed DWT coefficients;
   applying, by the processor, quantization to the extracted feature-related DWT data to obtain keys as results of the quantization;
   constructing, by the processor, a locality-sensitive fingerprint of the input data block based on the keys;
   computing, by the processor, a similarity degree between the locality-sensitive fingerprint of the input data block and a locality-sensitive fingerprint of each data block of a plurality of data blocks in a cache memory, wherein computing the similarity degree between the locality-sensitive fingerprint of the input data block and a locality-sensitive fingerprint of each data block of the plurality of data blocks in the cache memory comprises:
      reconstructing DWT coefficients from the locality-sensitive fingerprints;
      computing a distance between a series of the reconstructed DWT coefficients, wherein each series of the reconstructed DWT coefficients is represented by a vector; and
      determining the similarity degree as an inverse to the computed distance;
   selecting, by the processor, an optimal reference data block as the data block from the plurality of data blocks that has a largest similarity degree with the input data block;
   determining, by the processor, to apply a differential compression based on a similarity degree between the input data block and the optimal reference data block; and
   applying, by the processor, the differential compression to the input data block and the optimal reference data block.

2. The method of claim 1, further comprising:
   determining based on the similarity degree between the input data block and the optimal reference data block a traditional single-block compression is required; and
   applying the traditional single-block compression to the input data block.

3. The method of claim 1, wherein computing the similarity degree between the locality-sensitive fingerprint of the input data block and a locality-sensitive fingerprint of each data block of the plurality of data blocks in the cache memory further comprises:
   applying a reverse discrete wavelet transform to the reconstructed DWT coefficients to reconstruct data, wherein a distance is computed between series of the reconstructed data.

4. The method of claim 1, wherein the locality-sensitive fingerprints of the plurality of the data blocks in the cache memory are pre-computed.

5. The method of claim 1, wherein determining to apply the differential compression comprises:
   receiving a previously computed similarity degree between the input data block and the optimal reference data block;
   comparing the previously computed similarity degree with a threshold; and
   determining to apply the differential compression when the similarity degree is above the threshold.

6. The method of claim 5, wherein the threshold is pre-defined or defined dynamically to regulate a number of the data blocks to which compression is applied.

7. The method of claim 1, further comprising
   preprocessing of the input data block prior to computing the DWT coefficients and applying a wavelet transformation to the preprocessed input data block to compute the DWT coefficients, wherein preprocessing of the input data block includes one of: computing a histogram of n-grams of the input data block, computing a reduced histogram of n-grams of the input data block, computing a histogram of hashes of n-grams of the input data block, or computing a reduced histogram of hashes of n-grams of the input data block, wherein n-gram denotes a continuous sequence of length n, n≥1, of the input data block.

8. The method of claim 7, wherein reordering or sorting is applied to the results of preprocessing and applying a wavelet transformation is applied to the reordered or sorted preprocessed input data block to compute the DWT coefficients.

9. The method of claim 1, wherein the feature-related DWT data are extracted based at least on one of: values of first N coefficients, values of N coefficients with maximum magnitude, positions of N coefficients with maximum magnitude, or both values and positions of N coefficients with maximum magnitude.

10. The method of claim 1, further comprising:
    determining the input data block should be stored in the cache memory based on statistics of use of data blocks in the differential compression; and
    adding the input data block to the cache memory.

11. The method of claim 1, further comprising:
    determining data block should be removed from the cache memory based on statistics of use of one or more data blocks in the differential compression; and removing the one or more data blocks from the cache memory.

12. A computer, comprising:
a processor, and
a memory, wherein the memory has a plurality of instructions stored thereon that, when processed by the processor, cause the processor to be configured to:
receive an input data block;
compute discrete wavelet transform (DWT) coefficients based on the input data block;
extract feature-related DWT data from the computed DWT coefficients;
apply quantization to the extracted feature-related DWT data to obtain keys as results of the quantization;
construct a locality-sensitive fingerprint of the input data block based on the keys;
compute a similarity degree between the locality-sensitive fingerprint of the input data block and a locality-sensitive fingerprint of each data block of a plurality of data blocks in a cache memory, wherein computing the similarity degree between the locality-sensitive fingerprint of the input data block and a locality-sensitive fingerprint of each data block of the plurality of data blocks in the cache memory comprises:
reconstructing DWT coefficients from the locality-sensitive fingerprints;
computing a distance between a series of the reconstructed DWT coefficients, wherein each series of the reconstructed DWT coefficients is represented by a vector; and
determining the similarity degree as an inverse to the computed distance;
select an optimal reference data block as the data block from the plurality of data blocks that has a largest similarity degree with the input data block;
determine a differential compression based on a similarity degree between the input data block and the optimal reference data block; and
apply the differential compression to the input data block and the optimal reference data block.

13. The computer of claim 12, wherein processing the instructions further causes the processor to be configured to:
determine based on the similarity degree between the input data block and the optimal reference data block a traditional single-block compression is required; and
apply the traditional single-block compression to the input data block.

14. The computer of claim 12, wherein computing the similarity degree between the locality-sensitive fingerprint of the input data block and a locality-sensitive fingerprint of each data block of the plurality of data blocks in the cache memory further comprises:
apply a reverse discrete wavelet transform to the reconstructed DWT coefficients to reconstruct data, wherein a distance is computed between series of the reconstructed data.

15. The computer of claim 12, wherein the locality-sensitive fingerprints of the plurality of the data blocks in the cache memory are pre-computed.

16. The computer of claim 12, wherein processing the instructions further causes the processor to be configured to:
receive a previously computed similarity degree between the input data block and the optimal reference data block;
comparing the previously computed similarity degree with a threshold;
determine to apply the differential compression when the similarity degree is above the threshold.

17. The computer of claim 16, wherein the threshold is pre-defined or defined dynamically to regulate a number of the data blocks to which compression is applied.

18. The computer of claim 12, wherein processing the instructions further causes the processor to be configured to:
perform preprocessing of the input data block prior to computing the DWT coefficients and apply a wavelet transformation to the preprocessed input data block to compute the DWT coefficients, wherein do preprocessing of the input data block includes one of: compute a histogram of n-grams of the input data block, compute a reduced histogram of n-grams of the input data block, compute a histogram of hashes of n-grams of the input data block, or compute a reduced histogram of hashes of n-grams of the input data block, wherein n-gram denotes a continuous sequence of length n, $n \geq 1$, of the input data block.

* * * * *